United States Patent
Richter (10) Patent No.: US 7,457,171 B2
(45) Date of Patent: Nov. 25, 2008

(54) INTEGRATED SEMICONDUCTOR MEMORY WITH TRANSMISSION OF DATA VIA A DATA INTERFACE

(75) Inventor: Michael Richter, Ottobrunn (DE)

(73) Assignee: Qimonda AG, Munich (DE)

( * ) Notice: Subject to any disclaimer, the term of this patent is extended or adjusted under 35 U.S.C. 154(b) by 110 days.

(21) Appl. No.: 11/529,571

(22) Filed: Sep. 28, 2006

(65) Prior Publication Data

US 2007/0070671 A1    Mar. 29, 2007

(30) Foreign Application Priority Data

Sep. 28, 2005    (DE) ....................... 10 2005 046 363

(51) Int. Cl.
*G11C 7/10* (2006.01)
(52) U.S. Cl. ............... 365/189.05; 365/190; 365/189.07
(58) Field of Classification Search ............ 365/189.05, 365/189.07, 190
See application file for complete search history.

(56) References Cited

U.S. PATENT DOCUMENTS

| | | | |
|---|---|---|---|
| 7,106,654 B2 * | 9/2006 | Kock et al. ............. | 365/189.15 |
| 2002/0071331 A1 | 6/2002 | Al-Shamma et al. | |
| 2005/0157586 A1 * | 7/2005 | Kock et al. .................. | 365/233 |
| 2006/0149989 A1 * | 7/2006 | Marx et al. ................. | 713/500 |

\* cited by examiner

*Primary Examiner*—Andrew Q Tran
(74) *Attorney, Agent, or Firm*—Edell, Shapiro & Finnan, LLC (57) ABSTRACT

During a read access to a memory cell array of an integrated semiconductor memory device, data of a data word is fed to a data generator circuit which can be operated in the operating modes of noninverted and bitwise inverted transmission of data. The data generator circuit generates a control signal at a control terminal dependent on the transmission mode. The data generator circuit compares a data word fed to it from the memory cell array, with a data word fed to it from the memory cell array one clock period previously. The present operating mode of the data generator circuit is changed if more than half of the data of the two data words that are fed are different. Otherwise, the operating mode is maintained. It is thereby possible to reduce the number of data changes during a read access and thus the power loss of a data interface.

19 Claims, 3 Drawing Sheets

INTEGRATED SEMICONDUCTOR MEMORY WITH TRANSMISSION OF DATA VIA A DATA INTERFACE

CROSS REFERENCE TO RELATED APPLICATIONS

This application claims priority under 35 U.S.C. §119 to Application No. DE 102005046363.0 filed on Sep. 28, 2005, entitled "Integrated semiconductor memory device with Transmission of Data Via a Data Interface," the entire contents of which are hereby incorporated by reference.

FIELD OF THE INVENTION

The claimed device relates to an integrated semiconductor memory device wherein data is transmitted via a data interface. Furthermore, the claimed method relates to a method for operating an integrated semiconductor memory device wherein data is transmitted via a data interface.

BACKGROUND

Figure 1:
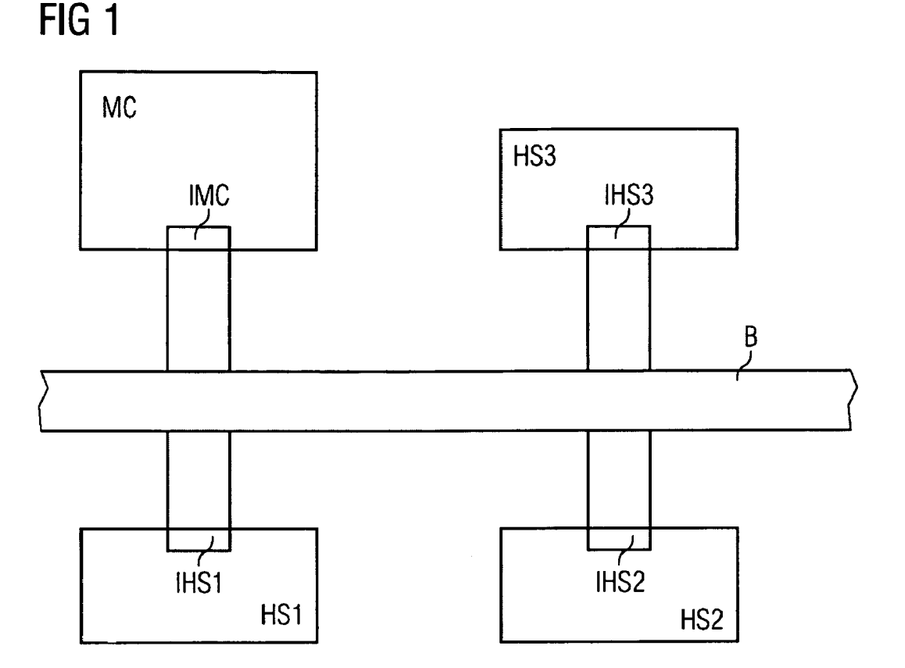
FIG. 1 shows a memory module comprising a memory controller and a plurality of integrated semiconductor memories.

FIG. 1 shows a simplified illustration of an arrangement of components of a memory module. Integrated semiconductor memories HS1, HS2 and HS3, are formed, for example, as DRAM (dynamic random access memory) memories, are interconnected and connected to a memory controller MC via a bus system B. In this case, the memory controller MC and the semiconductor memories are connected to the bus system B via a data interface IMC of the memory controller and via respective data interfaces IHS1, IHS2 and IHS3 of the semiconductor memories HS1, HS2 and HS3.

In integrated semiconductor memories, a significant portion of the power loss arises in the data interface to other components. In general, a plurality of data lines are connected to the data interface of a semiconductor memory. The power loss P per data line results as $P = \frac{1}{2} \times U^2 \times f \times L \times T$, where U indicates the specified interface voltage, f indicates the clock frequency, L indicates the capacitive loading and T indicates a rate of change of data changes. In this case, the interface voltage U indicates the voltage between a data low level and a data high level. The interface voltage typically lies between 1.8 volts and 3.3 volts in present-day DRAMs. The clock frequency f corresponds to the frequency at which the semiconductor memory or the memory module is operated. The capacitive loading L arises by virtue of the fact that a data interface of a semiconductor memory is essentially loaded by capacitive loads of other semiconductor memories, or of a memory controller, which are connected to the same bus. For example, the data interface IHS1 of the semiconductor memory HS1, as illustrated in FIG. 1, is loaded by the capacitive load of terminals via which the memory controller MC and also the semiconductor memories HS2 and HS3 are connected to the bus B. The bus capacitance also likewise influences the total capacitive loading L. The rate of change T indicates the probability with which data at the data interface change from a low level to a high level or from a high level to a low level.

Particularly in the case of DRAM memories for mobile battery-operated applications, such as mobile telephones or PDAs, for example, the proportion of the total power loss made up by the interface may amount to up to 50 percent. The background is that these DRAM memories usually have 32 data lines, whereas in the PC segment DRAM memories with four or eight data lines are predominant.

The power loss is reduced at the present time by using lower voltages for DRAM memories for mobile applications as compared to corresponding DRAM memories in the PC segment. Thus, by way of example, an interface voltage of nominally 2.5 volts is specified in accordance with a JEDEC standard for DDR SDRAMs, whereas an interface voltage of nominally 1.8 volts is specified for the functionally compatible mobile variant, also referred to as LPDDR (low power double data rate) SDRAM.

SUMMARY

During a read access to a memory cell array of an integrated semiconductor memory device, data of a data word is fed to a data generator circuit which can be operated in the operating modes of noninverted and bitwise inverted transmission of data. The data generator circuit generates a control signal at a control terminal in a manner dependent on the transmission mode. The data generator circuit compares a data word fed to it from the memory cell array, with a data word fed to it from the memory cell array one clock period previously. The present operating mode of the data generator circuit is changed if more than half of the data of the two data words that are fed are different. Otherwise, the operating mode is maintained. It is thereby possible to reduce the number of data changes during a read access and thus the power loss of a data interface.

The above and still further features and advantages of the present device will become apparent upon consideration of the following definitions, descriptions and descriptive figures of specific embodiments thereof, wherein like reference numerals in the various figures are utilized to designate like components. While these descriptions go into specific details of the device, it should be understood that variations may and do exist and would be apparent to those skilled in the art based on the descriptions herein.

BRIEF DESCRIPTION OF THE DRAWINGS

The invention is explained in more detail below with reference to exemplary embodiments, where.

DETAILED DESCRIPTION

The present device specifies an integrated semiconductor memory device with transmission of data via a data interface wherein the power loss occurring in the data interface is reduced. The present device also specifies a method for operating an integrated semiconductor memory device with transmission of data via a data interface wherein the power loss occurring in a data interface is reduced.

The integrated semiconductor memory device transmits data via a data interface, comprising: data terminals for respectively applying data of a data word, a memory cell array including memory cells, in each of which a bit of a data word can be stored, and a data generator circuit for receiving respective data of two successive first and second data words, which can be fed to the data generator circuit in each case from the memory cell array, and for generating data of a third data word. The data generator circuit can be operated in a first and second operating mode, in which case the data generator circuit, in the first operating mode, generates the data of the third data word in a manner corresponding to the data of the second data word and, in the second operating mode, generates the data of the third data word in inverted fashion with respect to the data of the second data word. The data generator circuit compares the data of the first data word with the data of the second data word and it changes the operating mode of the data generator circuit if it is established that more than half of the data of the first data word are different from the data of the second data word, and it maintains the operating mode of the data generator circuit if it is established that half or less than half of the data of the first data word differ from the data of the second data word. The data of the third data word can in each case be fed in inverted fashion or in noninverted fashion to one of the data terminals of the inverted semiconductor memory according to the set operating mode of the data generator circuit.

In accordance with one development, the integrated semiconductor memory device includes a control terminal for applying a control signal. The data generator circuit generates the control signal at the control terminal with a first state in the event of operation in the first operating mode and generates the control signal at the control terminal with a second state in the event of operation in the second operating mode.

Another embodiment of the integrated semiconductor memory device provides for the data generator circuit to comprise an evaluation device for generating an evaluation signal, a comparison device for generating the control signal and a data conversion circuit for generating the data of the third data word. The first and second data words can be fed to the evaluation device. The evaluation device compares a respective bit of the first data word with a respective bit of the second data word and generates the evaluation signal with a first state if half or less than half of the data of the first data word differ from the data of the second data word, and it generates the evaluation signal with a second state if more than half of the data of the first data word differ from the data of the second data word. The evaluation signal can be fed to the comparison device on the input side. The comparison device maintains the state of the control signal on the output side if the evaluation signal is in the first state, and it alters the state of the control signal on the output side if the evaluation signal is in the second state. The data conversion circuit is fed the first data word from the memory cell array and the control signal from the comparison device. The data conversion circuit generates the data of the third data word in a manner corresponding to the data of the second data word if the control signal is in the first state, and it generates the data of the third data word in inverted fashion with respect to the data of the second data word if the control signal is in the second state.

One development provides for the integrated semiconductor memory device to be operable synchronously with a clock signal. The evaluation device includes a storage circuit for storing the first data word with a control terminal for applying the clock signal, a comparison circuit for generating comparison signals and an evaluation circuit for generating the evaluation signal. The storage circuit generates, on the output side, the first data word one clock period of the clock signal later than the second data word was fed to it on the input side. The comparison circuit of the evaluation device is fed the first data word from the storage circuit and the second data word from the memory cell array. The comparison circuit of the evaluation device compares a respective bit of the first data word with a respective bit of the second data word and, on the output side, generates a respective one of the comparison signals with a first state if the bit of the first data word matches the bit of the second data word, and generates a respective one of the comparison signals with a second state if the bit of the first data word differs from the bit of the second data word. The comparison signals are fed to the evaluation circuit on the input side. The evaluation circuit generates the evaluation signal with a first state if half or less than half of the comparison signals differ in their respective states, and it generates the evaluation signal with a second state if more than half of the comparison signals differ in their respective states.

Another embodiment of the integrated semiconductor memory device provides for the comparison device to include a comparison circuit for generating the control signal. The comparison circuit of the comparison device is fed the evaluation signal and the control signal. The comparison circuit of the comparison device maintains the state of the control signal on the output side if the evaluation signal is in the first state, and it alters the state of the control signal on the output side if the evaluation signal is in the second state. The control signal generated by the comparison circuit on the output side is fed to the data conversion circuit and to the control terminal of the integrated semiconductor memory device.

In accordance with a further feature of the integrated semiconductor memory device, the comparison device includes a storage circuit for storing a state of the control signal with a control terminal for applying the clock signal. The storage circuit is fed the control signal from the comparison circuit of the comparison device. The storage circuit generates, on the output side, the clock signal one clock period of the clock signal later than the control signal was fed to it from the comparison circuit of the comparison device. The control signal generated by the storage circuit on the output side is fed to the comparison circuit of the comparison device.

In another embodiment of the integrated semiconductor memory device, a respective bit of a fourth data word can be applied to each of the data terminals of the integrated semiconductor memory device. Furthermore, the integrated semiconductor memory device comprises a data reception circuit for receiving the data of the fourth data word and for outputting data of a fifth data word. The data reception circuit is fed the control signal from the control terminal of the integrated semiconductor memory device. The data reception circuit generates the data of the fifth data word in a manner corresponding to the data of the fourth data word if it is driven by the first state of the control signal, and it generates the data of the fifth data word in inverted fashion with respect to the data of the fourth data word if it is driven by the second state of the control signal.

In accordance with a further embodiment, the integrated semiconductor memory device can be operated in a first operating state and in a second operating state. In a first operating state during a read access, data of a data word is fed from the memory cell array to the data terminals of the integrated semiconductor memory device with bridging of the data generator circuit and the data reception circuit. In the first operating state during a write access, data of a data word which is respectively present at one of the data terminals of the integrated semiconductor memory device are fed to the memory cell array with bridging of the data generator circuit and the data reception circuit. In a second operating state during a read access, data of a data word is fed from the memory cell array to the data terminals via the data generator circuit. In the second operating state during a write access, data of a data word present at one of the data terminals of the integrated semiconductor memory device is fed to the memory cell array via the data reception circuit.

The integrated semiconductor memory device may be formed as a DRAM memory, as a pseudo-SRAM memory or as a Flash memory.

A method for operating an integrated semiconductor memory device with transmission of data via a data interface in which the power loss occurring in a data interface is reduced is specified below. The method is implemented by providing an integrated semiconductor memory device including a memory cell array including memory cells, in each of which a bit of a data word can be stored, comprising a data generator circuit for receiving data of a first data word and for receiving data of a second data word, which can be fed to it in each case from the memory cell array, and for generating data of a third data word, in which the data generator circuit can be operated in a first operating mode and in a second operating mode, in which case the data generator circuit, in the first operating mode, generates the data of the third data word in a manner corresponding to the data of the second data word and, in the second operating mode, generates the data of the third data word in inverted fashion with respect to the data of the second data word. The data generator circuit is operated in the first or the second operating mode. Data of the first data word is read out from the memory cell array. The data of the first data word is fed to the data generator circuit. The data of the first data word is stored in a first storage circuit of the data generator circuit. Data of the second data word is read out from the memory cell array. The data of the second data word is fed to the data generator circuit. The data of the second data word is stored in a second storage circuit of the data generator circuit. A respective bit of the second data word is compared with a respective bit of the first data word. The operating mode of the data generator circuit is changed if it is established that more than half of the data of the second data word are different from the data of the first data word. By contrast, the operating mode of the data generator circuit is maintained if it is established that half or less than half of the data of the second data word differ from the data of the first data word. The data of the third data word is generated in a manner dependent on the operating mode of the data generator circuit. The data of the third data word is fed to the data terminals of the integrated semiconductor memory device.

One development of the method provides for generating a control signal with a first state if the data generator circuit is operated in the first operating mode. The control signal is generated with a second state if the data generator circuit is operated in the second operating mode.

A further development of the method includes: providing the integrated semiconductor memory device including a data reception circuit for receiving data of a fourth data word and for generating data of a fifth data word with an input terminal for applying the control signal. Data of the fourth data word is applied to the data terminals of the integrated semiconductor memory device. The data of the fourth data word is fed to the data reception circuit. The data of the fifth data word is generated in a manner corresponding to the data of the fourth data word if the data reception circuit is driven by a first state of the control signal. If the data reception circuit is driven by a second state of the control signal, the data of the fifth data word is generated in inverted fashion with respect to the data of the fourth data word. The data of the fifth data word is stored in the memory cell array.

According to the present device, the power loss during a data transmission via an interface of an integrated semiconductor memory device is reduced by reducing the rate of change T between data changes from a high level to a low level or from a low level to a high level. For this purpose, during a read access to memory cells of a memory cell array, the data of a data word which are read out from the memory cells are altered or maintained thereby reducing the number of data changes which occur during the outputting of two data words read out successively in the data interface.

According to the present device, there are two transmission modes for a data word D: noninverted and inverted bitwise. In this case, a control signal T serves for controlling the transmission mode. The present transmission mode is maintained or changed in a manner dependent on the number of changing data bits when two successive data words are read out from a memory cell array of an integrated semiconductor memory device. The transmission mode is maintained if, relative to a data word read out previously from the memory cell array, no more than half of the data to be transmitted change in the subsequent data word. If, for example, eight data bits DI1, . . . , DI8 of a data word are intended to be read out from memory cells of the memory cell array and be fed to a data interface for data transmission, then the present transmission mode of the data is maintained if, in the data word read out from the memory cell array, no more than four bits change in comparison with the data word read out one clock period previously. By contrast, if, for example, in the data word read out last, more than four bits change in comparison with the data word read out one clock period previously, the present transmission mode is changed from noninverted to inverted bitwise or from inverted bitwise to noninverted, depending on which transmission mode was active beforehand.

Figure 2:
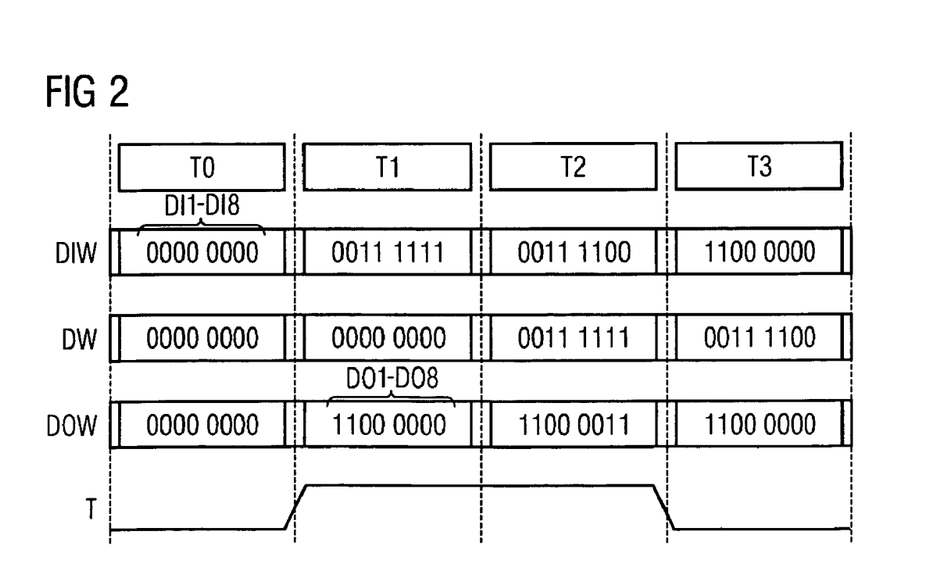
FIG. 2 shows data words generated during a data transmission at a data interface of an integrated semiconductor memory device.

FIG. 2 shows the transmission of data words via a data interface. In this case, a data word DIW comprising data DI1, . . . , DI8 is read out from the memory cell array and fed to a data generator circuit. In FIG. 2, the signal row designated by DW indicates the data of a data word which were transmitted to the data generator circuit one clock period previously relative to the data word DIW. After a comparison of the respective data of the data words DW and DIW, the data generator circuit generates the data of the data word DOW. If the data generator circuit is operated in the noninverted operating mode, the data of the data word DOW correspond to the data of the data word DIW. The data of the data word are not inverted by the data generator circuit 700, shown in FIG. 3, in this operating mode. If, by contrast, the data generator circuit is operated in the inverted operating mode, the data generator circuit generates the data of the data word DOW in inverted fashion with respect to the data of the data word DIW. The data of the data word DIW are inverted by the data generator circuit in this case.

As shown in FIG. 2, the data word DIW [DI1, . . . , DI8]=[0000 0000], for example, is transmitted with respect to a clock period T0. Since a data word DW [D0, . . . , D8]=[0000 0000], that is to say a data word having the same data bitwise, was transmitted one clock period before the clock period T0, there is no change in the data transmission mode. In the example of FIG. 2, the control signal T remains at the low level corresponding to the state "0", which indicates the noninverted transmission mode. Consequently, at the data interface the data generator circuit generates the data word DOW with the same data that the data word DIW has, too.

At the instant T1, the data word DIW [DI1, . . . , DI8]= [0011 1111] is read out from the memory cell array and fed to the data generator circuit. Within the data generator circuit, the data word DIW is compared with the data word DW that was fed to the data generator circuit with respect to the clock period T0. As can be gathered from FIG. 2, six data bits have changed relative to the instant T0. According to the present device, the data transmission mode is now changed and the control signal T is set to the state "1" for this purpose. The data word DIW is now inverted bitwise by the data generator circuit. In this case, the data word DOW [DO1, . . . , DO8]= [1100 0000] is transmitted to the data interface by the data generator circuit.

In a comparison of the data word DOW [DO1, . . . , DO8]= [1100 0000] with the data word DOW [DO1, . . . , DO8]= [0000 0000] transmitted via the interface one clock period previously, it becomes evident that only the first two bits have changed as a result of the inverted transmission in the generation of the present data word DOW relative to the data word DOW transmitted with respect to the clock period T0.

At the instant T2, the data generator circuit is driven with the data word DIW [DI1, . . . , DI8]=[0011 1100] read out from the memory cell array. Within the data generator circuit, the data word DIW of the clock period T2 is compared with the data word DW with which the data generator circuit was driven in the clock period T1. In a bitwise comparison of the data word DIW [DI1, . . . , DI8]=[0011 1100] with the data word DW [D1, . . . , D8]=[0011 1111] read out from the memory cell array one clock period previously, it emerges that only the last two bits have changed. Therefore, the control signal T remains at its "1" state. Since the state "1" indicates the data transmission mode of inverted bitwise, the data word DIW is inverted by the data generator circuit and the data word DOW [DO1, . . . , DO8]=[1100 0011] is thus generated at the data interface. A comparison of the data word DOW [DO1, . . . , DO8]=[1100 0000] of the clock period T1 with the data word DOW [DO1, . . . , DO8]=[1100 0011] of the clock period T2 shows that only two bits have changed.

At the clock instant T3, the data generator circuit is driven with the data word DIW [DI1, . . . , DI8]=[1100 0000] from the memory cell array. In a comparison with the data word DW [D1, . . . , D8]=[0011 1100] with which the data generator circuit was driven from the memory cell array at the clock period T2, it emerges that the first six bits have changed in the present data word DIW of the clock period T3. Consequently, since more than half of the data of the data word to be transmitted have changed, the transmission mode is changed from inverted bitwise to noninverted. Consequently, the data generator circuit generates, at the data interface, the data word DOW with the data corresponding to the data of the data word DIW. In a comparison of the data word DOW [DO1, . . . , DO8]=[1100 0011] with respect to the clock period T2 with the data word DOW [DO1, . . . , DO8]=[1100 0000] with respect to the clock period T3, it becomes clear that only two bits have changed.

If the data transmission modes had not been changed in the exemplary sequence illustrated in FIG. 2, as is the case in conventional DRAM memories, then 6+2+6=14 bits would have changed during the transmission of the four data words. In the case of the present device's changeover of the transmission mode from noninverted to inverted bitwise and from inverted bitwise to noninverted, only 2+2+2=6 bits and twice the state of the control signal T are changed in the data interface. Consequently, just eight data changes occur. Since the power loss is proportional to the data changes that have occurred in the data interface, the power loss is consequently reduced via the method according to the present device.

Figure 3:
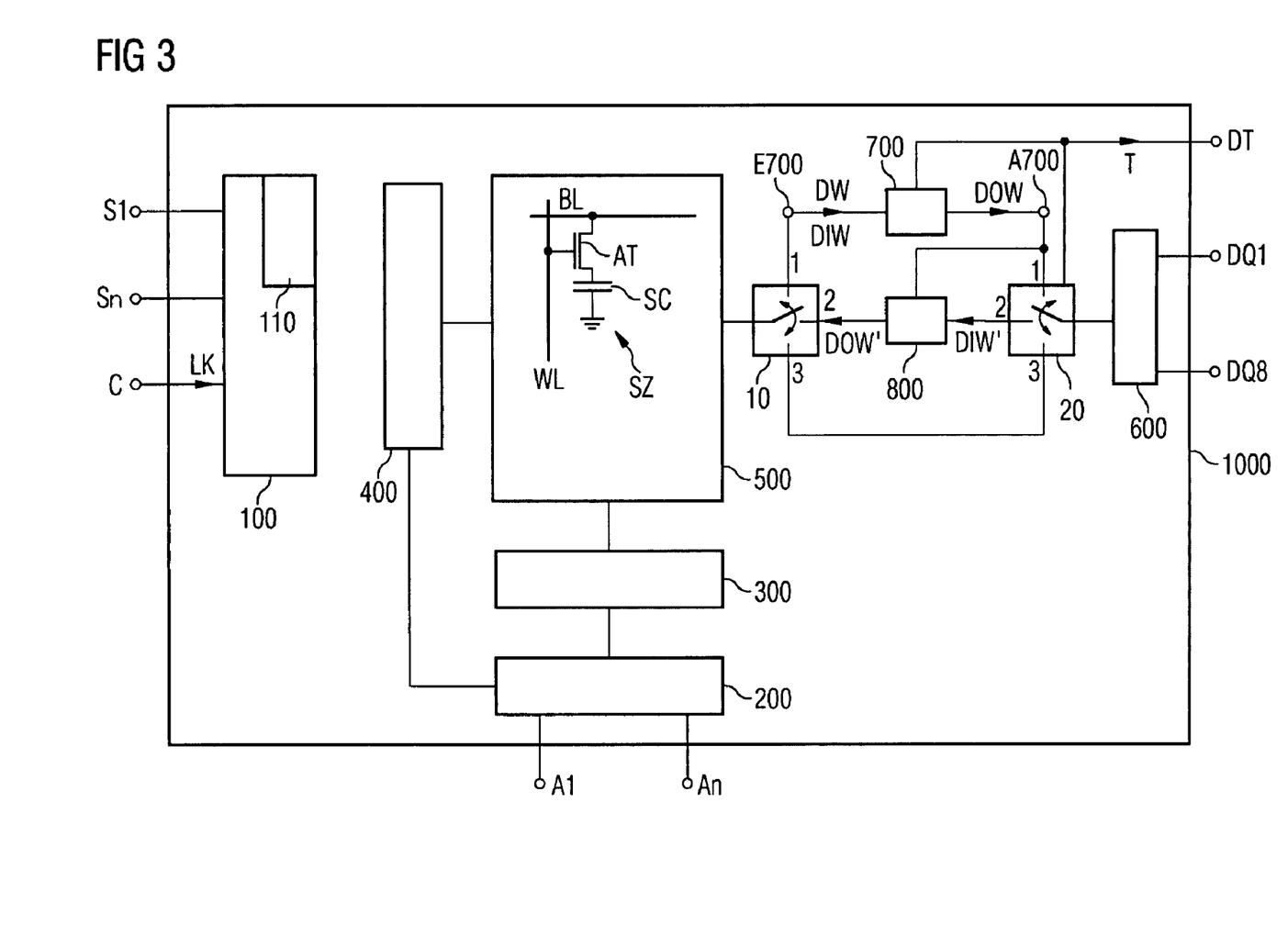
FIG. 3 shows an embodiment of an integrated semiconductor memory device for reducing the power loss that occurs during a data transmission via a data interface.

FIG. 3 shows an integrated semiconductor memory device 1000 comprising the data generator circuit 700 for reducing the power loss occurring during a data transmission via a data interface. The integrated semiconductor memory device comprises a control circuit 100 with control terminals S1, . . . , Sn for applying control signals to initiate functions such as, for example, a read access or a write access. A clock signal CLK is applied to a clock terminal C. The control circuit includes a configuration register 110, which can be used to define an operating state of the integrated semiconductor memory device. The configuration register 110 is formed, for example, as a mode register or as an extended mode register.

The integrated semiconductor memory device furthermore includes an address register 200 with address terminals A1, . . . , An for applying address signals. A column address applied to the address terminals is fed from the address register 200 to a column decoder 300. A row address applied to the address terminals is fed to a row decoder 400 via the address register 200. During a read access to memory cells of the memory cell array, the row decoder 400 activates a word line WL connected to the memory cells. Bit lines for a read access are selected via the column decoder.

The row decoder and the column decoder are connected to a memory cell array 500, in which, for example, a DRAM memory cell SZ is illustrated. The DRAM memory cell comprises a selection transistor AT and a storage capacitor SC. A control terminal of the selection transistor AT is connected to a word line WL. Via a corresponding control signal on the word line WL, the selection transistor AT can be switched into a conducting state and thus connects the storage capacitor SC to the bit line BL during a read access or a write access.

During a read access to the memory cell array 500, generally a plurality of memory cells are activated for the read access. The data stored in the memory cells represent a data word, which is fed to a controllable switch 10. In a switch position 1 of the controllable switch 10, a data word DIW read out from the memory cell array 500 is fed to the data generator circuit 700 via the terminal E700. The data generator circuit 700 generates a data word DOW on the output side after a comparison of the data of the data word DIW with the data of a data word DW which was fed to it one clock period previously. Depending on the transmission mode of the data generator circuit, the data of the data word DOW correspond to the data of the data word DIW or are inverted bitwise with respect to the data of the data word DIW. The data generator circuit 700 generates the control signal T in a manner dependent on the transmission mode, noninverted or inverted bitwise, and it feeds the control signal to a control terminal DT of the integrated semiconductor memory device.

In this case, the control signal T is generated with a state "0" if the data generator circuit is operated in the noninverted operating mode. By contrast, if the data generator circuit 700 is operated in the operating mode inverted bitwise, it generates the control signal T with a state "1" on the output side. For example, the data mask pin of a semiconductor memory, which is used for masking data terminals during a write access to an integrated semiconductor memory device, may serve as the control terminal DT. This terminal has no function during a read access and can thus be used for outputting the control signal T.

The data word DOW generated by the data generator circuit at a terminal A700 is fed to a controllable switch 20. In the switch position 1, the data word DOW can be fed via a data buffer circuit 600 to data terminals DQ1, . . . , DQ8 of the integrated semiconductor memory device.

During a write access to the integrated semiconductor memory device, the controllable switches 10 and 20 are switched in the switch position 2. Data of a data word DIW' that are present at the data terminals DQ1, ..., DQ8 are fed to a data reception circuit 800 during a write access. During a write access, the control terminal DT is driven by a control signal T. The data of the data word DIW' and also the control signal T have been generated, for example, via a memory controller connected to the same bus as the semiconductor memory shown in FIG. 3. The state "1" of the control signal T indicates that the data of the data word DIW' present at the data terminals were inverted via the transmitting memory controller. In this case, the data of the data word DIW' are inverted again via the receiving semiconductor memory and fed as data of a data word DOW' to the controllable switch 10. The original inversion of the transmitted data is reversed again by the renewed inversion. In the switch position 2 of the controllable switch 10, the data of the data word DOW' can be stored in the memory cell array 500.

If the transmitting memory controller drives the receiving semiconductor memory with the "0" state of the control signal T, the data of the data word DIW' present at the data terminals DQ1, ..., DQ8 are noninverted data. In this case, on the output side the data reception circuit 800 generates the data of the data set DOW' with the same data of the data word DIW'.

The integrated semiconductor memory device according to the described device presupposes that all components of a computer or of a computer module, for example the semiconductor memories likewise connected to the data bus and also the memory controller, are compatible with the integrated semiconductor memory device according to the described device. If compatibility is not present, there is the possibility of bridging the data generator circuit 700 and the data reception circuit 800 via switching the controllable switches 10 and 20 respectively into the switch position 3. In this case, the semiconductor memory, according to the described device, operates like a conventional semiconductor memory without the possibility of inverted transmission of data.

A configuration data stored within the configuration register 110 indicates to the control circuit 100 whether the integrated semiconductor memory device according to the described device is operated in a first operating state or a second operating state. In the first operating state, the control circuit 100 controls the controllable switches 10 and 20 into the switch position 3, so that the data generator circuit 700 and the data reception circuit 800 are bridged. In the first operating state, the integrated semiconductor memory device can thus communicate with further semiconductor memories which are not provided with the data generator circuit and data reception circuit according to the described device and are thus incompatible with the semiconductor memory according to the described device. In the second operating state, the control circuit 100 controls the controllable switches 10 and 20 into the switch position 1 during a read access, such that a data word is output via the data generator circuit 700. During the operation of the integrated semiconductor memory device in the second operating state and a write access, the control circuit 100 controls the controllable switches 10 and 20 into the switch position 2, so that data fed to the integrated semiconductor memory device as input data of a data word are inverted bitwise via the data reception circuit 800 or left in their state.

Figure 4:
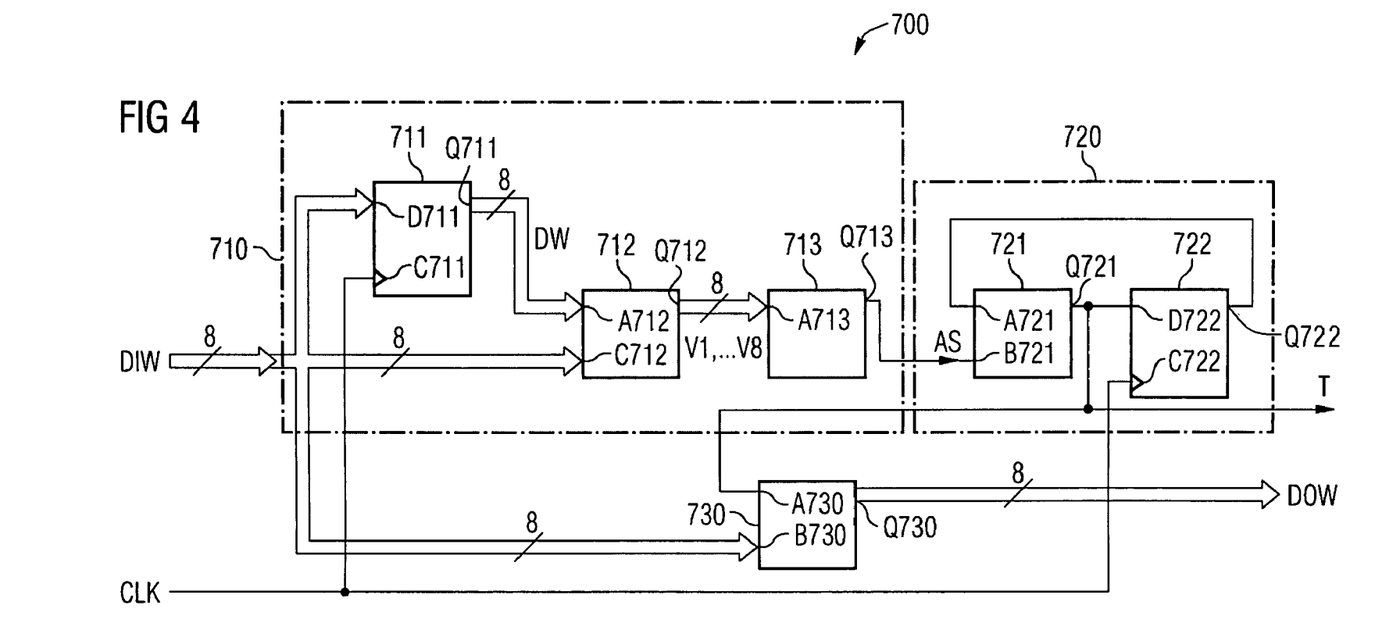
FIG. 4 shows an embodiment of a data generator circuit for reducing the power loss during a data transmission via a data interface.

FIG. 4 shows a configuration of the data generator circuit 700. The data generator circuit comprises an evaluation device 710, a comparison device 720 and a data conversion circuit 730. The evaluation device comprises a storage circuit 711, which is formed for example as a multivibrator, a comparison circuit 712, which is embodied for example as an XOR gate circuit, and an evaluation circuit 713. The data generator circuit illustrated in FIG. 4 is used during a read access to the memory cell array in the second operating state of the integrated semiconductor memory device. In this respect, FIG. 4 illustrates the case where in each case eight bits of a data word are transmitted on the bus lines indicated by broad arrows.

During a read access, the evaluation device 710 is driven by eight bits of a data word DW. These are stored in the multivibrator 711 upon the rising clock edge of a clock signal CLK with which the integrated semiconductor memory device is operated synchronously. Upon the next clock edge, the evaluation device 710 is driven by a subsequent data word DIW. The data of the data word DIW are fed to input terminals C712 of a comparison circuit 712. The data of the data word DW that were stored in the multivibrator 711 one clock period previously are likewise fed to input terminals A712 of the comparison circuit 712.

The comparison circuit 712 is formed, for example, as an octuple XOR gate circuit. It compares respective data of the data word DIW of the present clock period with data of the data word DW read out one clock period previously and generates comparison signals V1, ..., V8 at an output terminal Q712 depending on this comparison. The state of one of the comparison signals thus indicates the result of the comparison of data of the present data word DIW with data of the data word DW previously buffer-stored in the multivibrator 711. The comparison signals are fed to an input terminal A713 of the evaluation circuit 713. The evaluation circuit 713 generates at an output terminal Q713 an evaluation signal AS with a first state, for example the state "0", if at most half of the data of the data word DIW are different from the data of the data word DW buffer-stored one clock period previously. If, by contrast, more than half of the data of the present data word DIW differ from the data of the data word DW buffer-stored one clock period previously, the evaluation signal is generated with a second state, for example the state "1".

The evaluation signal AS is fed to the comparison device 720. The comparison device 720 comprises a comparison circuit 721 and also a storage circuit 722 connected downstream, which is formed for example as a multivibrator. The evaluation signal AS is fed to an input terminal B721 of the comparison circuit 721. The control signal T is fed to an input terminal A721. The comparison circuit 721 is preferably formed as an XOR gate circuit. The present state of the control signal T is thereby altered only when the evaluation signal AS has assumed the state "1", that is to say when the present data word DIW differs from the previously stored data word DW in more than half of the data bits. If, by contrast, the two data words differ in at most half of their data bits, the present state of the control signal T is maintained.

The retained or altered state of the control signal T is fed to the multivibrator 722 via an input terminal D722. The multivibrator 722 is furthermore controlled via the clock signal CLK via a clock terminal C722. Via a feedback path, the multivibrator 722 drives the input terminal A721 of the comparison circuit 721 with the control signal T one clock period later, the control signal indicating the state of inverted bitwise or noninverted of the data word DOW.

The data word DIW is furthermore fed to the data conversion circuit 730 at an input terminal B730. The control signal T is fed to an input terminal A730 of the data conversion circuit 730 from the output terminal Q721 of the comparison circuit 721. The data conversion circuit is formed as an octuple XOR gate circuit. What is achieved thereby is that data of the data word DIW that is fed to the input terminal B730 is inverted if the control signal T has the state "1". By contrast, if the control signal T has the state "0", the state of the data which is present at the input terminal B730 is retained.

Figure 5:
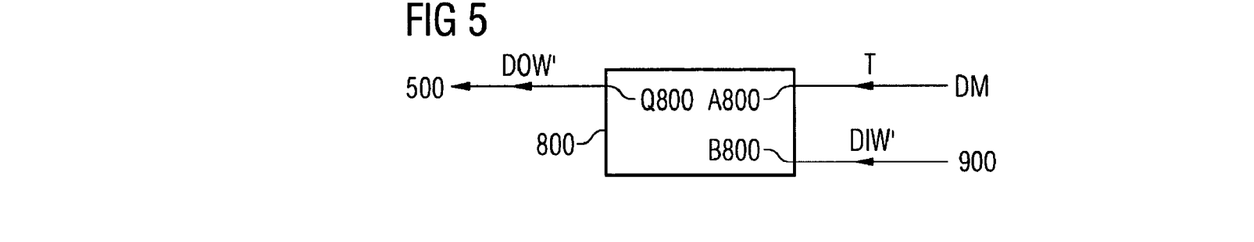
FIG. 5 shows a data reception circuit for converting the data words received by a data interface during a data transmission.

FIG. 5 shows an embodiment of the data reception circuit 800. During operation of the integrated semiconductor memory device in the second operating state, during a write access data of a data word DIW' are fed to the data reception circuit 800 from the data buffer circuit 600. At the same time, an input terminal A800 of the data reception circuit, which is connected to the control terminal DT, is driven by the control signal T. The data reception circuit 800 is formed as an octuple XOR gate circuit similarly to the data conversion circuit 730. Consequently, the data reception circuit 800 generates on the output side data of the data word DOW' in inverted fashion with respect to the data of the data word DIW' if the control signal T has the state "1". By contrast, if the control signal T has the state "0", it generates the data of the data word DOW' in a manner corresponding to the data of the data word DIW'. The data reception circuit thus reverses again the inversion of a data word fed to the integrated semiconductor memory device.

The number of changing data bits, the associated absolute number of possible data words, the relative frequency with which the data words occur and a weighted proportion of data changes during transmission of an 8-bit data word are entered in table 1. Given a length of the data word of 8 bits, a total of $2^8=256$ possible data words can be transmitted. The probability of occurrence for each data word is therefore $P=(0.5)^8=1/256$. If the relative frequencies are weighted with the number of changed bits, this results in the weighted proportions of data changes specified in the fourth row of the table. The weighted proportion of data changes results from multiplication of the values of the relative frequency by the number N of changing data bits divided by the expected value E=4. The weighted proportions of data changes thus represent a measure of the power consumption of the data interface.

TABLE 1

| Data transmission without using the data generator circuit | | | | | | | | | |
|---|---|---|---|---|---|---|---|---|---|
| Number N of changing data bits | 0 | 1 | 2 | 3 | 4 | 5 | 6 | 7 | 8 |
| Absolute number of possible data words | 1 | 8 | 28 | 56 | 70 | 56 | 28 | 8 | 1 |
| Relative frequency [%] | 0.39 | 3.13 | 10.94 | 21.88 | 27.34 | 21.88 | 10.94 | 3.13 | 0.39 |
| Weighted proportion of data changes [%] | 0.00 | 0.78 | 5.47 | 16.41 | 27.34 | 27.34 | 16.41 | 5.47 | 0.78 |

Table 2 shows the number N of changing data bits, the number of signal changes without the control signal T, the number of signal changes with the control signal T, and also the weighted proportion of data changes during the transmission of an 8-bit data word with a circuit arrangement of an integrated semiconductor memory device according to the described device. Since an inversion takes place in more than four changing data bits of two successive data words, the weighted proportion of data changes, which represents a measure of the power consumption of the data interface, decreases in contrast to table 1. A reduction of the total number of data changes by 18.3% results overall when using the data generator circuit according to the described device.

TABLE 2

| Data transmission with the use of the data generator circuit | | | | | | | | | |
|---|---|---|---|---|---|---|---|---|---|
| Number N of changing data bits | 0 | 1 | 2 | 3 | 4 | 5 | 6 | 7 | 8 |
| Number of signal changes with inversion, without T | 0 | 1 | 2 | 3 | 4 | 3 | 2 | 1 | 0 |
| Number of signal changes with inversion, with T | 0 | 1 | 2 | 3 | 4 | 4 | 3 | 2 | 1 |
| Weighted proportion of data changes [%] | 0.00 | 0.78 | 5.47 | 16.41 | 27.34 | 21.88 | 8.20 | 1.56 | 0.10 |

While the device has been described in detail with reference to specific embodiments thereof, it will be apparent to one of ordinary skill in the art that various changes and modifications can be made therein without departing from the spirit and scope thereof. Accordingly, it is intended that the present device covers the modifications and variations of this described device provided they come within the scope of the appended claims and their equivalents.

What is claimed is:

1. A memory device comprising:
   data terminals configured to apply data of a data word;
   a memory cell array including memory cells to store data of a data word;
   a data generator circuit configured to receive respective data of two successive data words, the two successive data words including a first data word including bits and a second data word including bits that are fed to the data generator circuit from the memory cell array, and to generate data of a third data word including bits and transmit the data of the third data word to the data terminals, wherein the data generator circuit is further configured to operate in one of a first operating mode where the bits of the generated third data word are non-inverted and correspond with the bits of the second data word and a second operating mode where the bits of the generated third data word are inverted with respect to the bits of the second data word, and the data generator circuit is configured to compare the bits of the first data word with the bits of the second data word and to change from one of the first and second operating modes to the other of the first and second operating modes in response to the comparison establishing that more than half of the bits of the first data word differ from the bits of the second data word; and a control terminal to apply a control signal, wherein the data generator circuit is configured to generate the control signal at the control terminal in a first state during operation in the first operating mode and to generate the control signal at the control terminal in a second state during operation in the second operating mode.

2. The memory device of claim 1, wherein:

the data generator circuit comprises an evaluation device to generate an evaluation signal, a comparison device to generate the control signal, and a data conversion circuit to generate the data of the third data word;

the evaluation device is configured to receive the first and second data words and compare a respective bit of the first data word with a respective bit of the second data word, and the evaluation device is further configured to generate the evaluation signal in a first state in response to the comparison establishing that no more than half of the data of the first data word differ from the data of the second data word, and the evaluation device is configured to generate the evaluation signal in a second state in response to the comparison establishing that more than half of the data of the first data word differ from the data of the second data word;

the comparison device is configured to receive the evaluation signal and maintain the state of the control signal in response to the evaluation signal being in the first state, and the comparison device is further configured to alter the state of the control signal in response to the evaluation signal being in the second state; and the data conversion circuit is configured to receive the first data word from the memory cell away and the control signal from the comparison device and to generate the data of the third data word in accordance with one of the first and second operating modes based upon the state of the control signal.

3. The memory device of claim 2, wherein:

the memory device is configured to operate synchronously with a clock signal;

the evaluation device comprises a storage circuit to store the first data word, a control terminal to apply the clock signal, a comparison circuit to generate comparison signals and an evaluation circuit to generate the evaluation signal;

the storage circuit is configured to generate the first data word at one clock period of the clock signal later than when the second data word was fed to the storage circuit;

the comparison circuit is configured to feed the first data word from the storage circuit and the second data word from the memory cell array;

the comparison circuit is configured to compare each bit of the first data word with each respective bit of the second data word and to generate a plurality of comparison signals corresponding with the comparison of the bits of the first and second data words, such that the comparison circuit generates a comparison signal with a first state in response to a bit of the first data word matching a respective bit of the second data word and the comparison circuit generates a comparison signal with a second state in response to a bit of the first data word differing from a respective bit of the second data word; and the evaluation circuit is configured to receive the comparison signals from the comparison circuit and to generate the evaluation signal in the first state in response to no more than half of the comparison signals differing in their respective states and to generate the evaluation signal in the second state in response to more than half of the comparison signals differing in their respective states.

4. The memory device of claim 3, wherein the storage circuit of the evaluation device comprises a multivibrator.

5. The memory device of claim 3, wherein the comparison circuit comprises an XOR gate circuit.

6. The memory device of claim 2, wherein:

the comparison device comprises a comparison circuit to generate the control signal;

the comparison circuit is configured to receive the evaluation and control signals, and the comparison circuit is further configured to maintain the state of the control signal in response to the evaluation signal being in the first state and to alter the state of the control signal on the output side of the comparison circuit in response to the evaluation signal being in the second state; and the data conversion circuit and the control terminal are configured to receive the control signal generated by the comparison circuit.

7. The memory device of claim 6, wherein:

the comparison device comprises a storage circuit to store a state of the control signal with a control terminal to apply the clock signal;

the storage circuit is configured to receive the control signal from the comparison circuit and to generate the control signal one clock period of the clock signal later than the control signal fed to the storage circuit from the comparison circuit; and the comparison circuit is configured to receive the control signal generated by the storage circuit.

8. The memory device of claim 7, wherein the storage circuit comprises a multivibrator.

9. The memory device of claim 6, wherein the comparison circuit comprises an XOR gate circuit.

10. The memory device of claim 2, wherein the data conversion circuit comprises an XOR gate circuit.

11. The memory device of claim 1, wherein the control terminal that generates the control signal comprises a terminal to apply a masking signal suitable to mask at least one of the data terminals of the memory device during a write access.

12. The memory device of claim 1, wherein respective data of a fourth data word including bits is applicable to each of the data terminals of the memory device, and the memory device further comprises:

a data reception circuit configured to receive the control signal from the control terminal of the memory device and the data of the fourth data word and to output data of a fifth data word including bits, wherein the data reception circuit is further configured to generate the fifth data word with bits corresponding and non-inverted with respect to the bits of the fourth data word in response to the control signal being in the first state and to generate the fifth data word with bits inverted with respect to the bits of the fourth data word in response to the control signal being in the second state.

13. The memory device of claim 12, wherein the data reception circuit comprises an XOR gate circuit, and the data reception circuit is configured to receive the data of the fourth data word and the control signal and to generate the data of the fifth data word.

14. The memory device of claim 12, wherein:
the memory device is operable in a first operating state during a read access in which data of a data word is fed from the memory cell array to the data terminals of the memory device with bridging of the data generator circuit and the data reception circuit, and during a write access in which data of a data word that is present at one of the data terminals of the integrated semiconductor memory device is fed to the memory cell array with bridging of the data generator circuit and the data reception circuit; and
the memory device is operable in a second operating state during a read access in which data of a data word is fed from the memory cell array to the data terminals of the memory device via the data generator circuit, and during a write access in which data of a data word present at one of the data terminals of the memory device is fed to the memory cell array via the data reception circuit.

15. The memory device of claim 14, further comprising a configuration register to store a configuration bit in a first state or a second state, wherein the state of the configuration bit stored in the configuration register is based upon operation of the memory device in the first operating state or the second operating state.

16. The memory device of claim 15, wherein the configuration register comprises a mode register of the integrated semiconductor memory device.

17. The memory device of claim 1, wherein the memory device comprises one of a DRAM memory device, a pseudo-SRAM memory device, and a Flash memory device.

18. A method for operating a memory device comprising a memory cell array including memory cells to store data of a data word and a data generator circuit that operates in a first operating mode and a second operating mode, the method comprising:
reading out data of a first data word including bits from the memory cell array and feeding the data of the first data word to the data generator circuit;
storing the data of the first data word in a first storage circuit of the data generator circuit;
reading out data of a second data word including bits from the memory cell array and feeding the data of the second data word to the data generator circuit;
storing the data of the second data word in a second storage circuit of the data generator circuit;
comparing the bits of the second data word with the bits of the first data word;
performing an operating mode setting in response to the comparison of the bits of the second data word with the bits of the first data word, wherein the operating mode of the data generator circuit is maintained in one of the first and second operating modes in response to the comparison establishing that no more than half of the bits of the first data word differ from the bits of the second data word, and the operating mode of the data generator circuit is changed from one of the first and second operating modes to the other of the first and second operating modes in response to the comparison establishing that more than half of the data of the second data word differ from the data of the first data word;
generating a third data word including bits via the data generator circuit which is operating in one of the first and second modes, wherein the third data word is generated with bits that correspond and are non-inverted with respect to the bits of the second data word when the data generator circuit operates in the first operating mode, and the third data word is generated with bits that are inverted with respect to the bits of the second data word when the data generator circuit operates in the second operating mode;
generating a control signal in a first state in response to the data generator circuit being operated in the first operating mode; and
generating the control signal in a second state in response to the data generator circuit being operated in the second operating mode.

19. The method of claim 18, wherein the memory device further comprises a data reception circuit, and the method further comprises:
applying data of a fourth data word including bits to data terminals of the memory device;
feeding the data of the fourth data word to the data reception circuit;
generating data of a fifth data word including bits utilizing the data reception circuit, wherein the bits of the fifth data word correspond and are non-inverted with respect to the bits of the fourth data word when the control signal is in the first state, and the bits of the fifth data word are inverted with respect to the bits of the fourth data word when the control signal is in the second state; and
storing the data of the fifth data word in the memory cell array.

* * * * *

UNITED STATES PATENT AND TRADEMARK OFFICE
CERTIFICATE OF CORRECTION

PATENT NO. : 7,457,171 B2  Page 1 of 1
APPLICATION NO. : 11/529571
DATED : November 25, 2008
INVENTOR(S) : Michael Richter It is certified that error appears in the above-identified patent and that said Letters Patent is hereby corrected as shown below:

Column 13, line 43: replace "cell away" with -- cell array --.

Signed and Sealed this

Twenty-fourth Day of February, 2009

JOHN DOLL
*Acting Director of the United States Patent and Trademark Office*